(12) United States Patent
Choi et al.

(10) Patent No.: US 11,568,785 B2
(45) Date of Patent: *Jan. 31, 2023

(54) DISPLAY DEVICE

(71) Applicant: LG Display Co., Ltd., Seoul (KR)

(72) Inventors: Jeong Hyeon Choi, Seoul (KR); Binn Kim, Seoul (KR); Joon Soo Han, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/677,717

(22) Filed: Feb. 22, 2022

(65) Prior Publication Data

US 2022/0180792 A1 Jun. 9, 2022

Related U.S. Application Data

(63) Continuation of application No. 17/092,163, filed on Nov. 6, 2020, now Pat. No. 11,288,999, which is a
(Continued)

(30) Foreign Application Priority Data

Dec. 31, 2015 (KR) ......................... 10-2015-0190982

(51) Int. Cl.
*G09G 3/20* (2006.01)
*G09G 3/3233* (2016.01)
(Continued)

(52) U.S. Cl.
CPC ......... *G09G 3/2003* (2013.01); *G09G 3/3233* (2013.01); *G09G 3/3258* (2013.01);
(Continued)

(58) Field of Classification Search
None
See application file for complete search history.

(56) References Cited

U.S. PATENT DOCUMENTS 5,831,708 A * 11/1998 Hiraishi ................ G02F 1/1333
349/39
6,014,189 A 1/2000 Budd et al.
(Continued)

FOREIGN PATENT DOCUMENTS

CN 104752479 A 7/2015
CN 104795423 A 7/2015
(Continued)

OTHER PUBLICATIONS

China National Intellectual Property Administration, First Notification of Office Action, CN Patent Application No. 201610370601.0, dated Oct. 18, 2019, 18 pages.
(Continued)

*Primary Examiner* — Dorothy Harris
(74) *Attorney, Agent, or Firm* — Fenwick & West LLP

(57) ABSTRACT

Disclosed is a display device for increasing an aperture ratio of a transmissive part. The display device includes data lines overlapping with one or more of the pixels emitting light to display an image. Each pixel includes subpixels arranged within the pixel along a same direction as the data lines. The display device further includes transmissive parts arranged in the first direction and corresponding to adjacent pixels. In addition to the data lines overlapping the pixels, the display device may include power lines and reference voltage lines parallel with the data lines and overlapping with the pixels. The display device may include scan lines and sensing lines arranged to cross the transmissive parts and data lines. As a result, the number of lines crossing the transmissive parts is reduced, thereby increasing an aperture ratio of the transmissive parts.

19 Claims, 10 Drawing Sheets

Related U.S. Application Data continuation of application No. 16/705,902, filed on Dec. 6, 2019, now Pat. No. 10,861,371, which is a continuation of application No. 15/139,115, filed on Apr. 26, 2016, now Pat. No. 10,535,290.

(51) Int. Cl.
*G09G 3/3258* (2016.01)
*H01L 27/32* (2006.01)

(52) U.S. Cl.
CPC ........ *H01L 27/326* (2013.01); *H01L 27/3276* (2013.01); *G09G 2300/0426* (2013.01); *G09G 2300/0452* (2013.01); *G09G 2300/0456* (2013.01); *G09G 2300/0465* (2013.01); *G09G 2320/0295* (2013.01)

(56) References Cited

U.S. PATENT DOCUMENTS

| | | |
|---|---|---|
| 9,502,487 B2 | 11/2016 | Jeong et al. |
| 10,535,290 B2 | 1/2020 | Choi et al. |
| 10,861,371 B2 | 12/2020 | Choi et al. |
| 2006/0119556 A1 | 6/2006 | Winters et al. |
| 2007/0063192 A1 | 3/2007 | Peng |
| 2009/0039355 A1 | 2/2009 | Kwak |
| 2011/0102308 A1 | 5/2011 | Nakamura et al. |
| 2011/0163661 A1 | 7/2011 | Lee et al. |
| 2011/0163664 A1 | 7/2011 | Kana et al. |
| 2011/0169720 A1 | 7/2011 | Hwang et al. |
| 2011/0175097 A1 | 7/2011 | Sona et al. |
| 2011/0204369 A1 | 8/2011 | Ha et al. |
| 2011/0205198 A1 | 8/2011 | Jeong et al. |
| 2011/0220922 A1 | 9/2011 | Kim et al. |
| 2012/0080680 A1 | 4/2012 | Choi et al. |
| 2012/0280215 A1 | 11/2012 | Choi et al. |
| 2013/0154910 A1 | 6/2013 | Chu et al. |
| 2013/0208017 A1* | 8/2013 | Gu .................. G09G 3/3208 345/690 |
| 2014/0183479 A1 | 7/2014 | Park et al. |
| 2015/0144891 A1 | 5/2015 | Park |
| 2015/0145845 A1 | 5/2015 | Nam et al. |
| 2015/0187851 A1 | 7/2015 | Lee et al. |
| 2015/0206929 A1 | 7/2015 | Sato |
| 2015/0300599 A1 | 10/2015 | Lee et al. |
| 2015/0311265 A1 | 10/2015 | Matsueda et al. |
| 2015/0357383 A1 | 12/2015 | Chung et al. |
| 2015/0364530 A1 | 12/2015 | Yoon et al. |
| 2016/0055794 A1 | 2/2016 | Lee et al. |
| 2016/0064411 A1 | 3/2016 | Park et al. |
| 2016/0111487 A1 | 4/2016 | Jeong et al. |
| 2016/0149165 A1* | 5/2016 | Kim ................... H01L 51/5284 257/40 |
| 2016/0365401 A1 | 12/2016 | Seo et al. |
| 2018/0122886 A1 | 5/2018 | Kim et al. |
| 2020/0066817 A1 | 2/2020 | Kim |

FOREIGN PATENT DOCUMENTS

| | | |
|---|---|---|
| CN | 105006480 A | 10/2015 |
| EP | 2341544 A2 | 7/2011 |
| JP | 2015-102873 A2 | 6/2015 |
| KR | 10-2015-0117359 A | 10/2015 |

OTHER PUBLICATIONS

United States Office Action, U.S. Appl. No. 15/139,115, dated May 23, 2019, 21 pages.
United States Office Action, U.S. Appl. No. 15/139,115, dated Nov. 29, 2018, 17 pages.
United States Office Action, U.S. Appl. No. 15/139,115, dated May 30, 2018, 19 pages.
United States Office Action, U.S. Appl. No. 17/092,163, dated Aug. 5, 2021, 24 pages.

* cited by examiner

DISPLAY DEVICE

CROSS-REFERENCE TO RELATED APPLICATION

This application is a continuation of U.S. patent application Ser. No. 17/092,163 filed on Nov. 6, 2020 which is a continuation application of U.S. patent application Ser. No. 16/705,902 filed on Dec. 6, 2019, which is a continuation application of U.S. patent application Ser. No. 15/139,115 filed on Apr. 26, 2016 (now U.S. Pat. No. 10,535,290 issued on Jan. 14, 2020), which claims the benefit of Korean Patent Application No. 10-2015-0190982, filed on Dec. 31, 2015, all of which are hereby incorporated by reference as if fully set forth herein.

BACKGROUND

Field of the Disclosure

The present disclosure relates to a transparent display device.

Discussion of the Related Art

As the field of processing and displaying a massive amount of information advances, various flat panel display (FPD) devices have been developed. Examples of the FPD devices include liquid crystal display (LCD) devices, plasma display panel (PDP) devices, field emission display (FED) devices, electroluminescence display (ELD) devices, and organic light emitting diode (OLED) display devices.

Transparent display devices which enable a user to see a background or an object disposed behind the transparent display device are being actively researched. Transparent display devices may be applied to various fields. Transparent display devices include an information recognition function, an information processing function, and an information display function by using a transparent electronic device, thereby solving spatial and visual limitations of electronic devices. For example, a transparent display device may be fixed to windows of buildings or vehicles in order to implement a smart window that allows a background to be seen or displays an image.

The transparent display device may be implemented as an organic light emitting display device. In this case, the transparent display device includes a plurality of transmissive parts, which transmit incident light, and a plurality of emissive parts emitting light. A user may look at a background image incident on a backside of the transparent display device through the transmissive parts, and when the emissive parts emit the light, the user may look at an image displayed by the emissive parts.

In order to increase an aperture ratio of each of the transmissive parts of the transparent display device, metal lines are not formed in each of the transmissive parts. However, when the transmissive parts and the emissive parts of the transparent display device are arranged in parallel in a horizontal direction, a plurality of data lines for supplying data voltages to the emissive parts, a plurality of power lines for supplying a source voltage, and a plurality of reference voltage lines for supplying a reference voltage are arranged to cross the transmissive parts. In this case, an aperture ratio of each of the transmissive parts is reduced due to the data lines, the power lines, and the reference voltage lines crossing the transmissive parts.

SUMMARY

Accordingly, the disclosed subject matter provides a transparent display device that substantially obviates one or more problems due to limitations and disadvantages of the related art.

One aspect of the disclosed subject matter includes a display device including transmissive parts with an increased aperture ratio.

Additional advantages and features will be set forth in part in the description which follows and in part will become apparent to those having ordinary skill in the art upon examination of the following or may be learned from practice of the disclosed subject matter. The objectives and other advantages may be realized and attained by the structure particularly pointed out in the written description and claims hereof as well as the appended drawings.

To achieve these and other advantages, one embodiment provides a display device including a plurality of pixels emitting light to display an image, where each pixel includes a plurality of subpixels arranged within the pixel along a first direction; a plurality of transmissive parts arranged in the first direction and each corresponding to an adjacent pixel, the transmissive parts transmitting incident light; and a plurality of data lines arranged parallel to the first direction, each data line overlapping with one or more of the pixels.

According to an aspect, the transmissive parts may transmit incident light from behind the transparent display device to in front of the display device, or vice versa. The transmissive parts may transmit light emitted by the subpixels of the display device to outside of the display device. According to an aspect, the plurality of transmissive parts is substantially coplanar with the plurality of subpixels.

According to an aspect, the display device further includes a plurality of power lines arranged in the first direction, where the plurality of power lines overlap with the plurality of pixels and are arranged parallel to the plurality of transmissive parts. Each transmissive part may be disposed between one of the plurality of data lines and one of the plurality of power lines.

According to an aspect, the display device further includes a plurality of reference voltage lines arranged in the first direction parallel to the plurality of data lines, where the plurality of reference voltage lines overlap with the plurality of pixels and are arranged parallel to the plurality of transmissive parts.

According to an aspect, the display device further includes a plurality of scan lines arranged in a second direction across the plurality of data lines. The display device may further include a plurality of sensing lines arranged in the second direction, where the plurality of sensing lines are arranged across the plurality of data lines. Each transmissive part may be disposed between one of the plurality of scan lines and one of the plurality of sensing lines.

According to an aspect, each pixel comprises a plurality of organic light emitting devices each including an anode electrode, an organic light emitting layer, and a cathode electrode, a plurality of driving transistors driving the organic light emitting device, a plurality of scan transistors controlling the plurality of driving transistors, and a plurality of sensing transistors for compensating the plurality of driving transistors. The plurality of organic light emitting devices included in the pixel may be arranged in the first direction parallel to the data lines.

According to an aspect, each pixel further comprises a first bridge line connecting a corresponding power line to the plurality of driving transistors, the first bridge line crossing at least one of the plurality of data lines. Each pixel may further include a second bridge line connecting a corresponding reference voltage line to the plurality of sensing transistors, where the second bridge line intersects at least one of the plurality of data lines, and where the first bridge line is parallel to the second bridge line.

According to an aspect, the plurality of driving transistors overlap with a first anode electrode of the pixel, the plurality of sensing transistors overlap with a second anode electrode of the pixel. Each pixel may further include a plurality of capacitors storing charge (e.g., corresponding to a data voltage), and the plurality of capacitors may overlap with the second anode electrode of the pixel and a third anode electrode of the pixel. For example, the plurality of subpixels correspond to red, green, and blue light.

According to an aspect, the plurality of capacitors further overlap with a fourth anode electrode of the pixel. For example, the plurality of subpixels correspond to red, green, blue, and white light.

According to an aspect, an area of each transmissive part is less than two times of an area of the plurality of subpixels of each pixel.

According to an aspect, each pixel includes at least one capacitor overlapping with at least two subpixels in the pixel. The plurality of capacitors may be arranged in a second direction across the plurality of data lines (e.g., perpendicular to the data lines).

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosed subject matter and are incorporated in and constitute a part of this application, illustrate embodiments of the disclosed subject matter and together with the description serve to explain the principle of the disclosed subject matter. In the drawings.

DETAILED DESCRIPTION

Figure 1:
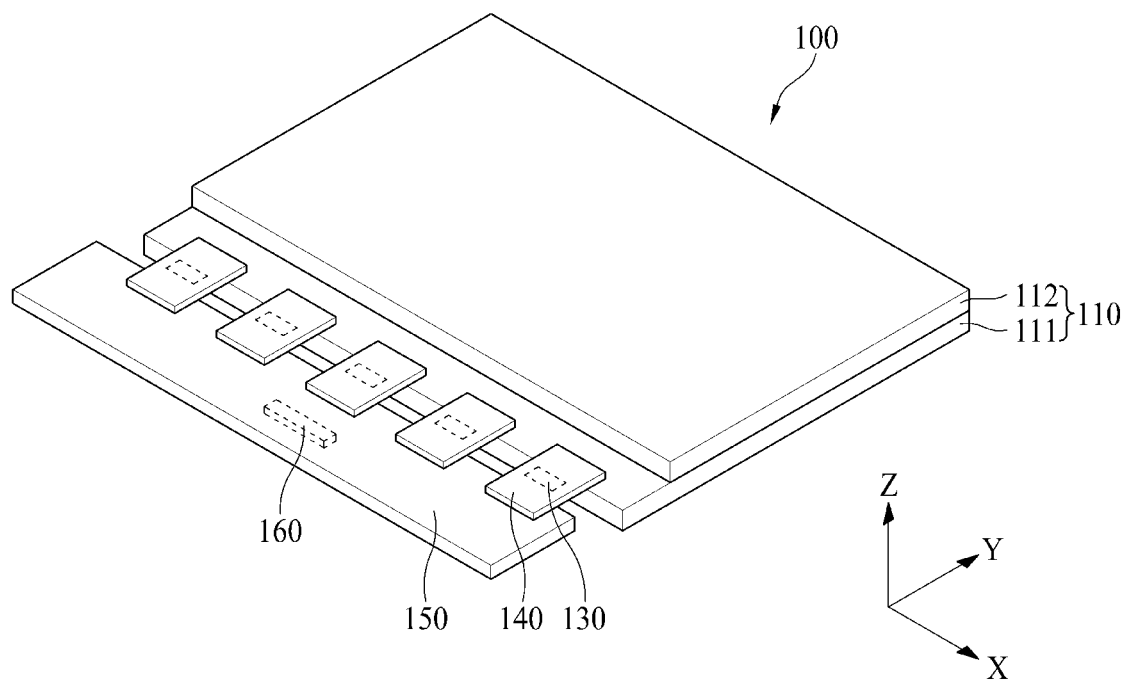
FIG. 1 is a perspective view illustrating a transparent display device according to an embodiment.

Reference will now be made in detail to embodiments of the disclosed subject matter, examples of which are illustrated in the accompanying drawings. Wherever possible, the same reference numbers will be used throughout the drawings to refer to the same or like parts.

Advantages and features of the disclosed subject matter, and implementation methods thereof will be clarified through following embodiments described with reference to the accompanying drawings. The disclosed subject matter may, however, be embodied in different forms and should not be construed as limited to the embodiments set forth herein. Rather, these embodiments are provided so that this disclosure will be thorough and complete, and will fully convey the scope of the disclosed subject matter to those skilled in the art. Further, the present invention is only defined by scopes of claims.

A shape, a size, a ratio, an angle, and a number disclosed in the drawings for describing embodiments are merely an example, and thus, the disclosed subject matter is not limited to the illustrated details. Like reference numerals refer to like elements throughout. In the following description, when the detailed description of the relevant known function or configuration is determined to unnecessarily obscure the important point of the disclosed subject matter, the detailed description will be omitted.

Where "comprise," "have," or "include" are used in the present specification, another part may be added unless "only" or "consisting" is used. The terms of a singular form may include plural forms unless referred to the contrary.

In construing an element, the element should be construed as including an error range even if there is no explicit description of an error range.

In describing a position relationship, for example, when a position relation between two parts is described as "on," "over," "under," or "next," one or more other parts may be disposed between the two parts unless "just" or "directly" is used.

In describing a time relationship, for example, when the temporal order is described as "after," "subsequent," "next," or "before," a case which is not continuous may be included unless "just" or "directly" is used.

It will be understood that, although the terms "first," "second," and so forth may be used herein to describe various elements, these elements should not be limited by these terms. These terms are only used to distinguish one element from another. For example, a first element could be termed a second element, and, similarly, a second element could be termed a first element, without departing from the scope of the disclosed subject matter.

An X axis direction, a Y axis direction, and a Z axis direction should not be construed as only a geometric relationship where a relationship therebetween is vertical, and may denote having a broader directionality within a scope where elements of the disclosed subject matter operate functionally.

The term "at least one of" or "one or more of" should be understood as including any and all combinations of one or more of the associated listed items. For example, the meaning of "at least one of a first item, a second item, and a third item" includes the combination of all items proposed from two or more of the first item, the second item, and the third item as well as just one of the first item, the second item, or the third item.

Features of various embodiments of the disclosed subject matter may be partially or overall coupled to or combined with each other, and may be variously inter-operated with each other and driven technically as those skilled in the art can sufficiently understand. The embodiments of the disclosed subject matter may be carried out independently from each other, or may be carried out together in co-dependent relationship.

Hereinafter, embodiments of disclosed subject matter will be described in detail with reference to the accompanying drawings.

Figure 2:
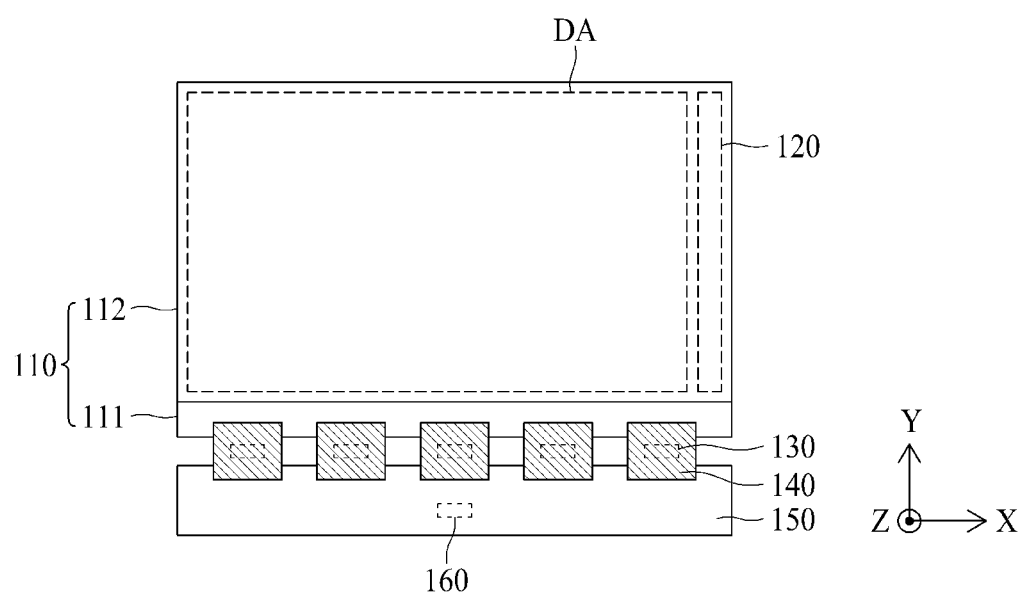
FIG. 2 is a plan view illustrating a first substrate, a gate driver, a source drive integrated circuit (IC), a flexible film, a circuit board, and a timing controller illustrated in FIG. 1.

FIG. 1 is a perspective view illustrating a transparent display device 100 according to an embodiment. FIG. 2 is a plan view illustrating a first substrate, a gate driver, a source drive integrated circuit (IC), a flexible film, a circuit board, and a timing controller illustrated in FIG. 1.

Referring to FIGS. 1 and 2, the transparent display device 100 according to an embodiment may include a display panel 110, a gate driver 120, a source drive IC 130, a flexible film 140, a circuit board 150, and a timing controller 160.

The display panel 110 may include a first substrate 111 and a second substrate 112. The second substrate 112 may be an encapsulation substrate. The first substrate 111 and the second substrate 112 may each be formed as plastic, glass, and/or the like.

A plurality of scan lines, a plurality of sensing lines, a plurality of data lines, a plurality of power lines, and a plurality of reference voltage lines may be arranged on one surface of the first substrate 111 facing the second substrate 112. The scan lines and the data lines may be arranged to intersect each other. The sensing lines may be arranged in parallel with the scan lines. The power lines and the reference voltage lines may be arranged in parallel with the data lines. Also, a plurality of emissive parts emitting light and a plurality of transmissive parts which transmit incident light may be provided on one surface of the first substrate 111. A thin film transistor (TFT) and an organic light emitting device may be provided in each of the emissive parts. The emissive parts and the transmissive parts will be described in detail with reference to FIGS. 3 to 6.

The display panel 110, as illustrated in FIG. 2, may include a display area DA that displays an image and a non-display area NDA that does not display an image. The scan lines, the sensing lines, the data lines, the power lines, the reference voltage lines, the emissive parts, and the transmissive parts may be provided in the display area DA, and the gate driver 120 and a plurality of pads may be provided in the non-display area NDA. The display area DA will be described in detail with reference to FIGS. 3, 8, and 11.

The gate driver 120 may sequentially supply gate signals to the gate lines according to a gate control signal input from the timing controller 160. The gate driver 120 may be provided in the non-display area NDA outside one side or each of both sides of the display area DA of the display panel 110 in a gate driver in panel (GIP) type, but is not limited thereto. In other embodiments, the gate driver 120 may be manufactured as a driving chip, mounted on a gate flexible film, and the gate flexible film may be attached to the non-display area NDA outside the one side or each of the both sides of the display area DA of the display panel 110 in a tape automated bonding (TAB) type.

The source drive IC 130 may receive digital video data and a source control signal from the timing controller 160. The source drive IC 130 may convert the digital video data into analog data voltages according to the source control signal and may respectively supply the analog data voltages to the data lines. When the source drive IC 130 is manufactured as a driving chip, the source drive IC 130 may be mounted on the flexible film 140 in a chip-on film (COF) type or a chip-on plastic (COP) type.

A plurality of pads including the data pads may be provided in the non-display area NDA of the display panel 110. A plurality of lines connecting the pads to the source drive IC 130 and a plurality of lines connecting the pads to lines of the circuit board 150 may be provided in the flexible film 140. The flexible film 140 may be attached to the pads by using an anisotropic conductive film, and thus, the pads may be connected to the lines of the flexible film 140.

The circuit board 150 may be attached to a plurality of the flexible films 140. A plurality of circuits which are respectively implemented as a plurality of driving chips may be mounted on the circuit board 150. For example, the timing controller 160 may be mounted on the circuit board 150. The circuit board 150 may be a printed circuit board (PCB) or a flexible printed circuit board (FPCB).

The timing controller 160 may receive digital video data and a timing signal from an external system board (not shown) through a cable of the circuit board 150. The timing controller 160 may generate the gate control signal for controlling an operation timing of the gate driver 120 and a source control signal for controlling a plurality of the source drive ICs 130, based on the timing signal. The timing controller 160 may supply the gate control signal to the gate driver 120 and may supply the source control signal to the source drive ICs 130.

Figure 3:
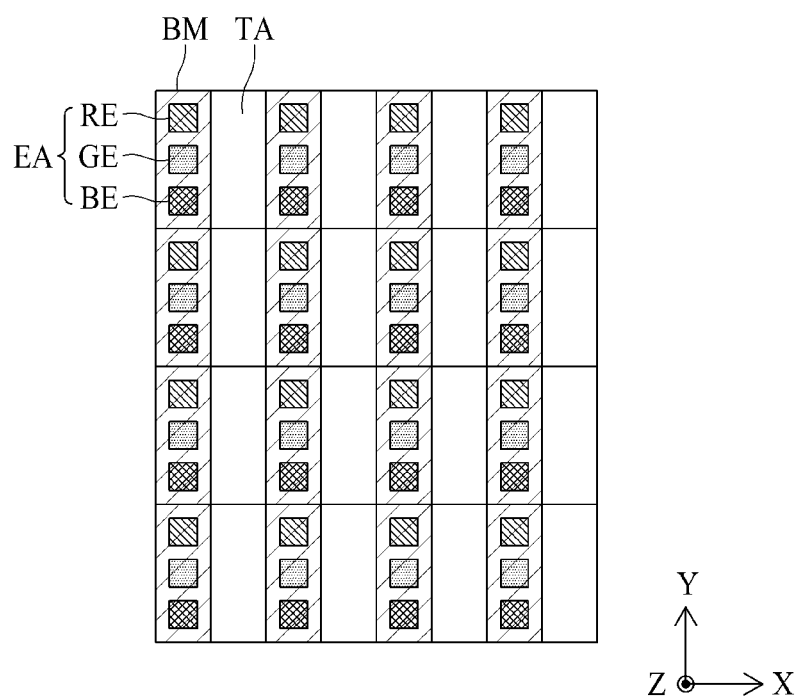
FIG. 3 is a plan view illustrating a portion of a display area of a display panel according to an embodiment.

FIG. 3 is a plan view illustrating a portion of a display area of a display panel according to an embodiment.

Referring to FIG. 3, a plurality of transmissive parts TA and a plurality of emissive part EA may be provided in a display area DA. Due to the transmissive parts TA, a user may look at an object or a background located on a rear surface of a transparent display panel 100. The emissive parts EA may display an image.

The transmissive parts TA may be areas that transmit incident light. Each of the emissive parts EA may be an area emitting light and may be a non-transmissive part that does not transmit incident light. An area of each of the transmissive parts TA may be similar to that of each of the emissive parts EA.

Each of the emissive parts EA may include a plurality of emissive subparts. In FIG. 3, each of the emissive parts EA is illustrated as including a red emissive part RE, a green emissive part GE, and a blue emissive part BE. The red emissive part RE may be an area emitting red light, the green emissive part GE may be an area emitting green light, and the blue emissive part BE may be an area emitting blue light. In the emissive parts EA, adjacent emissive subparts may be divided by a black matrix BM. In one embodiment, each emissive part is a pixel, which may contain one or more of red, green, blue, white, or cyan subpixels (i.e., emissive subparts).

The emissive parts EA and the transmissive parts TA, as illustrated in FIG. 3, may be arranged in a Y-axis direction in parallel with the data lines. Alternatively or additionally, the emissive parts EA and the transmissive parts TA may be arranged adjacent to each other in a lengthwise direction of a scan line. For example, each of the transmissive parts TA may be disposed between adjacent emissive parts EA in an X-axis direction parallel to the scan lines.

Therefore, in an embodiment, in addition to the data lines, the power lines and the reference voltage lines parallel with the data lines may be disposed to overlap with the emissive parts EA, when viewed from a perspective perpendicular to a plane including the emissive parts. Furthermore, the data lines, the power lines, and the reference voltage lines do not overlap or intersect with the transmissive parts TA. The scan lines and the sensing lines may be arranged to cross the transmissive parts TA. As a result, the number of lines crossing the transmissive parts TA is reduced, thereby increasing an aperture ratio of each of the transmissive parts TA.

Moreover, the data lines, the power lines, and the reference voltage lines may each be formed of an opaque metal material. Therefore, when the data lines, the power lines, and the reference voltage lines are arranged to cross the transmissive parts, some of light passing through the transmissive parts may be scattered by the data lines, the power lines, and the reference voltage lines. In this case, haze occurs. When haze occurs, a background behind a transparent display device seen through the transmissive parts appears washed out.

However, in an embodiment, in addition to the data lines, the power lines and the reference voltage lines parallel with the data lines may be disposed to overlap with the emissive parts EA. Therefore, in an embodiment, instead of the data lines, the power lines, and the reference voltage lines, the scan lines and the sensing lines may be arranged to cross the transmissive parts TA. That is, according to an embodiment, the number of lines crossing the transmissive parts TA is reduced. Accordingly, a degree to which light passing through the transmissive parts is scattered by lines crossing the transmissive parts is reduced, thereby decreasing haze.

Hereinafter, a structure of each of an emissive part and a transmissive part included in a transparent display device according to an embodiment will be described in detail with reference to FIGS. 4 to 6.

Figure 4:
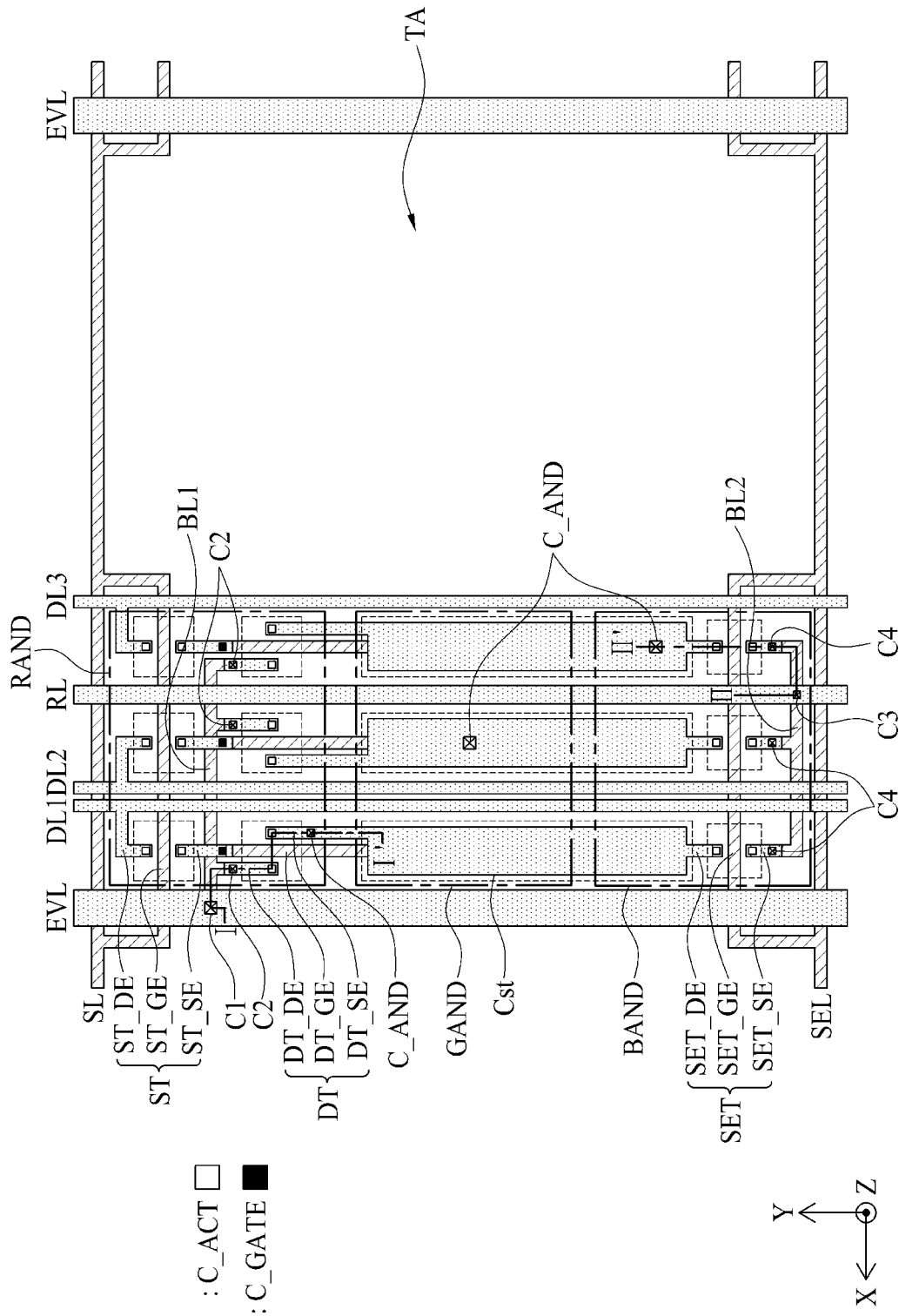
FIG. 4 is a plan view illustrating in detail an example of an emissive part and a transmissive part illustrated in FIG. 3.

FIG. 4 is a plan view illustrating in detail an example of an emissive part EA and a transmissive part TA illustrated in FIG. 3. In FIG. 4, an example where an emissive part EA includes three emissive subparts such as a red emissive part RE, a green emissive part GE, and a blue emissive part BE will be described in detail.

Referring to FIG. 4, a plurality of data lines DL1 to DL3, a power line EVL, and a reference voltage line RL may be disposed to overlap with an emissive part EA. First and second data lines DL1 and DL2 may be disposed adjacent to each other, and the reference voltage line RL may be disposed between the second data line DL2 and a third data line DL3. Also, the power line EVL may be disposed on one end of the emissive part EA. In FIG. 4, the third data line DL3 is illustrated as being disposed on a right end of the emissive part EA, and the power line EVL is illustrated as being disposed on a left end of the emissive part EA. Alternatively, the respective positions of the power line EVL and the reference voltage line RL are swapped, so the reference voltage line RL is disposed on one end of the emissive part EA, and the power line EVL is disposed between data lines such as second data line DL2 and the third data line DL3.

A scan line SL and a sensing line SEL may intersect the data lines DL1 to DL3 and may be disposed across the emissive part EA and a transmissive part TA. The scan line SL has a closed loop between a first transmissive part and a second transmissive part. The closed loop of the scan line SL starts from one side of the sub-emissive parts and ends at another side of the sub-emissive parts.

Each of a plurality of emissive subparts may include a driving transistor DT, a scan transistor ST, a sensing transistor SET, a capacitor Cst, and an organic light emitting device. The organic light emitting device may include an anode electrode and a cathode electrode. In FIG. 4, for convenience of description, only the anode electrode of the organic light emitting device is illustrated. Although illustrated as having a rectangular shape, the anode electrode RAND/GAND/BAND may have another shape, such as a quadrangular shape or a diamond shape, for example.

Each of the emissive subparts may be implemented in a top emission type. Therefore, as illustrated in FIG. 4, the driving transistor DT, scan transistor ST, sensing transistor SET, and capacitor Cst of each emissive subpart may be provided in the emissive part EA. The capacitor Cst overlaps with at least two of the emissive subparts within the emissive part EA.

The driving transistor DT may include a gate electrode DT_GE connected to a source electrode of the scan transistor ST, a source electrode DT_SE connected to an anode electrode RAND/GAND/BAND of the organic light emitting device, and a drain electrode DT_DE connected to the power line EVL through a first bridge line BL1. The gate electrode DT_GE of the driving transistor DT may be connected to a source electrode ST_SE of the scan transistor ST through a gate contact hole C_GATE. The source electrode DT_SE and drain electrode DT_DE of the driving transistor DT may be connected to an active layer DT_ACT of the driving transistor DT through a semiconductor contact hole C_ACT.

The first bridge line BL1 may be connected to the power line EVL through a first contact hole C1 and may be connected to the drain electrode DT_DE of the driving transistor DT through a second contact hole C2. Therefore, the drain electrode DT_DE of the driving transistor DT may be connected to the power line EVL through the first bridge line BL1. The first bridge line BL1 may intersect the reference voltage line RL or at least one of the data lines DL1 to DL3. The first bridge line BL1 does not intersect a transmissive part TA.

That is, in an embodiment, the data lines DL1 to DL3, the power line EVL, and the reference voltage line RL may be arranged to overlap with the emissive part (an emission area) EA. Therefore, the first bridge line BL1 for crossing the reference voltage line RL and/or at least one of the data lines DL1 to DL3 may be used in order for the power line EVL to be connected to the drain electrodes DT_DE of a plurality of the driving transistors DT.

The scan transistor ST may include a gate electrode ST_GE connected to the scan line SL, the source electrode ST_SE connected to the gate electrode DT_GE of the driving transistor DT, and a drain electrode ST_DE connected to one of the data line DL1 to DL3. The source electrode ST_SE and drain electrode ST_DE of the scan transistor ST may be connected to an active layer of the scan transistor ST through the semiconductor contact hole C_ACT.

The sensing transistor SET may include a gate electrode SET_GE connected to the sensing line SEL, a source electrode SET_SE connected to the reference voltage line RL through a second bridge line BL2, and a drain electrode SET_DE connected to the source electrode DT_SE of the driving transistor DT. The source electrode SET_SE and drain electrode SET_DE of the sensing transistor SET may be connected to an active layer of the sensing transistor SET through the semiconductor contact hole C_ACT.

The second bridge line BL2 may be connected to the reference voltage line RL through a third contact hole C3 and may be connected to the source electrode SET_SE of the sensing transistor SET through a fourth contact hole C4. Therefore, the source electrode SET_SE of the sensing transistor SET may be connected to the reference voltage line RL through the second bridge line BL2. The second bridge line BL2 may intersect at least one of the data lines DL1 to DL3. The second bridge line BL2 does not intersect a transmissive part TA.

That is, in an embodiment, the data lines DL1 to DL3, the power line EVL, and the reference voltage line RL may be arranged to overlap with the emissive part EA. Therefore, the second bridge line BL2 for crossing at least one of the data lines DL1 to DL3 may be used in order for the reference voltage line RL to be connected to the source electrodes SET_SE of a plurality of the sensing transistors SET.

The capacitor Cst may be provided in an overlap area where the gate electrode DT_GE of the driving transistor DT overlaps the source electrode DT_SE. A size of the capacitor Cst may be adjusted by changing the overlap area where the gate electrode DT_GE of the driving transistor DT overlaps the source electrode DT_SE.

Each of the anode electrodes RAND, GAND, and BAND may be connected to the drain electrode DT_GE of the driving transistor DT through an anode contact hole C_AND.

Figure 5:
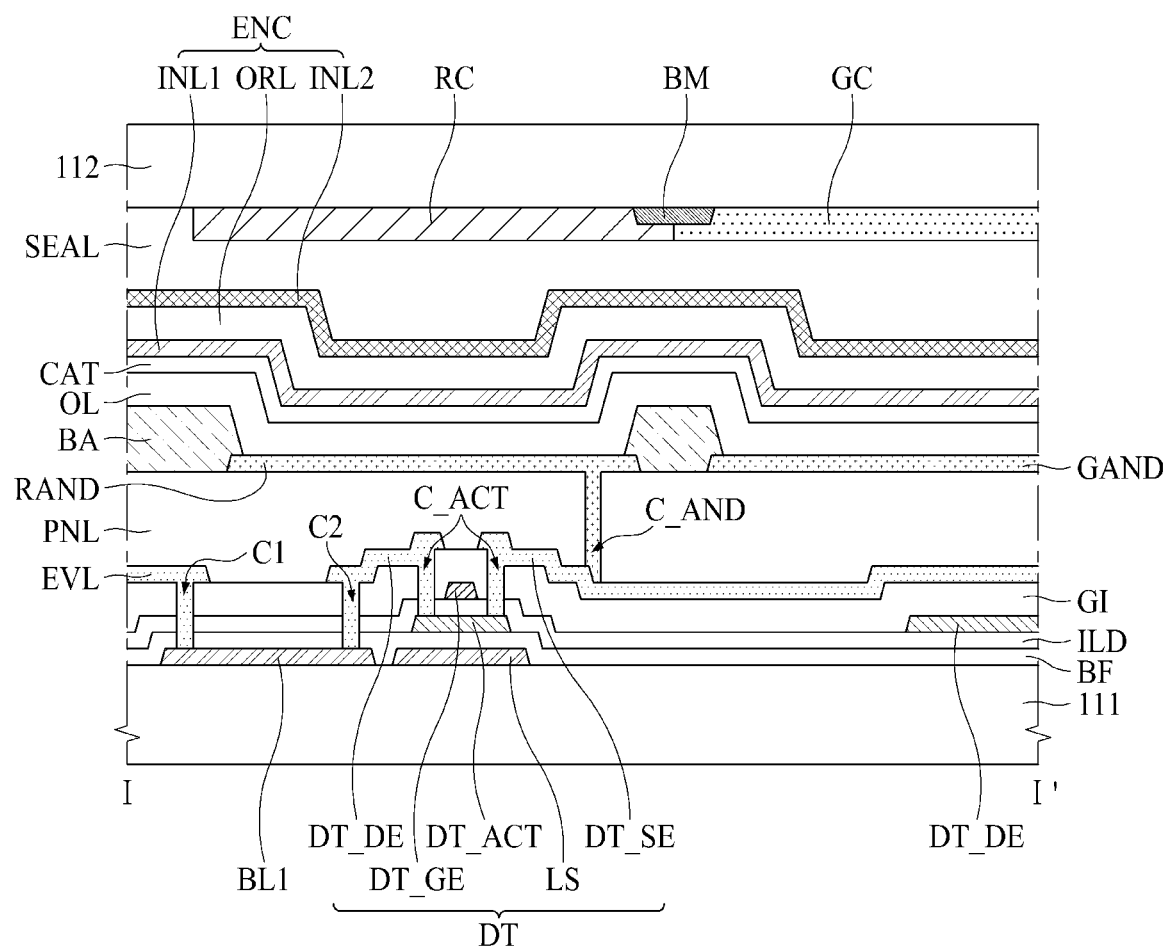
FIG. 5 is a cross-sectional view taken along line I-r of FIG. 4.
Figure 6:
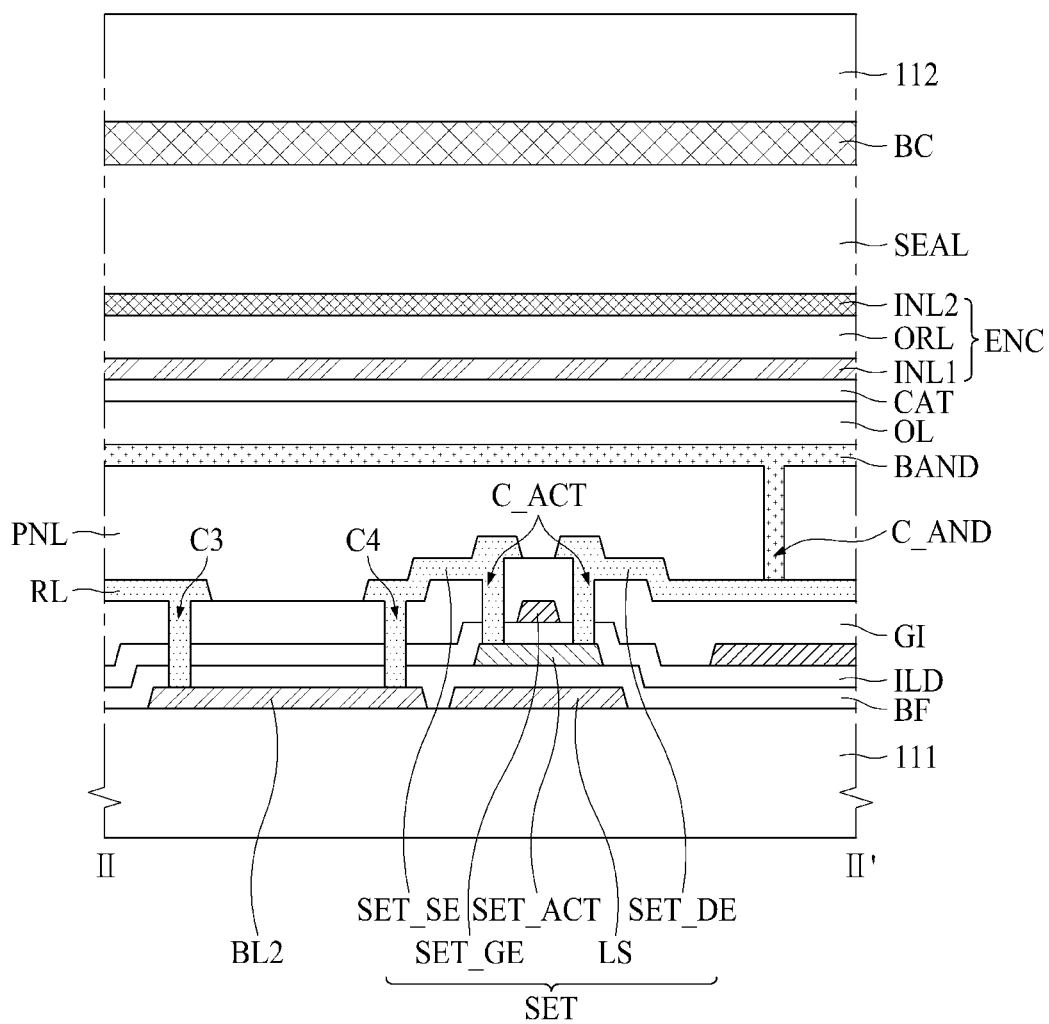
FIG. 6 is a cross-sectional view taken along line II-II' of FIG. 4.

FIG. 5 is a cross-sectional view taken along line I-I' of FIG. 4, and FIG. 6 is a cross-sectional view taken along line II-II' of FIG. 4. Hereinafter, a cross-sectional structure of an emissive part EA of a transparent display device according to an embodiment will be described in detail with reference to FIGS. 5 and 6.

Referring to FIGS. 5 and 6, a light shield metal pattern which includes the first and second bridge lines BL1 and BL2 and a light shield layer LS may be provided on the first substrate 111. The first bridge line BL1 may be a line for connecting the power line EVL to the drain electrodes DT_DE of a plurality of the driving transistors DT. The second bridge line BL2 may be a line for connecting the reference voltage line RL to the source electrodes SET_SE of a plurality of the sensing transistors SET. A plurality of the light shield layers LS may respectively overlap with active layers DT_ACT, ST_ACT, and SET_ACT of the transistors DT, ST, and SET. The light shield layers LS may be layers for preventing light from being incident on the active layers DT_ACT, ST_ACT, and SET_ACT of the transistors DT, ST, and SET. To this end, the light shield metal pattern may be formed of an opaque metal material that does not transmit light.

A buffer layer BF may be provided on the light shield metal pattern to cover the light shield metal pattern. The buffer layer BF may be a layer for insulating the light shield metal pattern from the active layers DT_ACT, ST_ACT, and SET_ACT of the transistors DT, ST, and SET. The buffer layer BF enhances an interface adhesive force of the active layers DT_ACT, ST_ACT, and SET_ACT. The buffer layer BF may be formed of a single layer including silicon oxide ($SiO_2$) or silicon nitride (SiNx) or a multilayer including silicon oxide ($SiO_2$) and silicon nitride (SiNx).

A semiconductor metal pattern including the active layers DT_ACT, ST_ACT, and SET_ACT of the transistors DT, ST, and SET may be formed on the buffer layer BF. Each of the active layers DT_ACT, ST_ACT, and SET_ACT of the transistors DT, ST and SET may include a channel layer, a first electrode, and a second electrode and may be optionally doped with impurities. When one side of the channel layer is connected to the first electrode, the other side may be connected to the second electrode.

An interlayer dielectric ILD may be formed on a semiconductor metal pattern to cover the semiconductor metal pattern. The interlayer dielectric ILD may be a layer for insulating the semiconductor metal pattern from the gate electrodes DT_GE, ST_GE, and SET_GE of the transistors DT, ST, and SET. The interlayer dielectric ILD may be formed of a single layer including silicon oxide ($SiO_2$) or silicon nitride (SiNx) or a multilayer including silicon oxide ($SiO_2$) and silicon nitride (SiNx).

A gate metal pattern, which includes the gate electrodes DT_GE, ST_GE, and SET_GE of the transistors DT, ST and SET, the scan line SL, and the sensing line SEL, may be formed on the interlayer dielectric ILD. The gate electrode DT_GE of each of a plurality of the driving transistors DT may be connected to the source electrode ST_SE of the scan transistor ST, the gate electrode ST_GE of each of a plurality of the scan transistors ST may be connected to the scan line SL, and the gate electrode SET_GE of each of a plurality of the sensing transistors SET may be connected to the sensing line SEL. The gate electrodes DT_GE, ST_GE, and SET_GE of the transistors DT, ST, and SET may respectively overlap with the active layers DT_ACT, ST_ACT, and SET_ACT of the transistors DT, ST and SET. The gate metal pattern may be formed in a single layer structure including molybdenum (Mo), titanium (Ti), aluminum (Al), or copper (Cu) or a multilayer structure including at least two materials of molybdenum (Mo), titanium (Ti), aluminum (Al), and copper (Cu).

A gate insulator GI may be formed on the gate metal pattern to cover the gate metal pattern. The gate insulator GI may be a layer for insulating the gate metal pattern from the source electrodes and drain electrodes DT_SE, DT_DE, ST_SE, ST_DE, SET_SE, and SET_DE of the transistors DT, ST, and SET. The gate insulator GI may be formed of a single layer including silicon oxide ($SiO_2$) or silicon nitride (SiNx) or a multilayer including silicon oxide ($SiO_2$) and silicon nitride (SiNx).

A source drain metal pattern, which includes the source electrodes and drain electrodes DT_SE, DT_DE, ST_SE, ST_DE, SET_SE, and SET_DE of the transistors DT, ST, and SET, the data lines DL1 to DL3, the power line EVL, and the reference voltage line RL, may be formed on the gate insulator GI. The source drain metal pattern may be formed in a single layer structure including molybdenum (Mo), titanium (Ti), aluminum (Al), or copper (Cu) or a multilayer structure including at least two materials of molybdenum (Mo), titanium (Ti), aluminum (Al), and copper (Cu).

The source electrodes DT_SE, ST_SE, and SET_SE of the transistors DT, ST, and SET may be respectively connected to the first electrodes of the active layers DT_ACT, ST_ACT, SET_ACT of the transistors DT, ST and SET through the active contact holes C_ACT. The drain electrodes DT_DE, ST_DE and SET_DE of the transistors DT, ST and SET may be respectively connected to the second electrodes of the active layers DT_ACT, ST_ACT, SET_ACT of the transistors DT, ST and SET through the active contact holes C_ACT. The active contact holes C_ACT may be respective holes which pass through the interlayer dielectric ILD and the gate insulator GI and expose the first electrodes or second electrodes of the active layers DT_ACT, ST_ACT, SET_ACT of the transistors DT, ST, and SET.

The power line EVL may be connected to the drain electrodes DT_DE of the driving transistors DT through the first bridge line BL1. In detail, the power line EVL may be connected to the first bridge line BL1 through the first contact hole C1. The first contact hole C1 may be a hole which passes through the buffer layer BF, the interlayer dielectric ILD, and the gate insulator GI and exposes the first bridge line BL1. The respective drain electrodes DT_DE of the driving transistors DT may be connected to the first bridge line BL1 through a plurality of the second contact holes C2. Each of the second contact holes C2 may be a hole which passes through the buffer layer BF, the interlayer dielectric ILD, and the gate insulator GI and exposes the first bridge line BL1.

The reference voltage line RL may be connected to the source electrodes SET_SE of the sensing transistors SET through the second bridge line BL2. In detail, the reference voltage line RL may be connected to the second bridge line BL2 through the third contact hole C3. The third contact hole C3 may be a hole which passes through the buffer layer BF, the interlayer dielectric ILD, and the gate insulator GI and exposes the second bridge line BL2. The respective source electrodes SET_SE of the sensing transistors SET may be connected to the second bridge line BL2 through a plurality of the fourth contact holes C4. Each of the fourth contact holes C4 may be a hole which passes through the buffer layer BF, the interlayer dielectric ILD, and the gate insulator GI and exposes the second bridge line BL2.

A planarization layer PLN may be formed on the source drain metal pattern to cover the source drain metal pattern. The planarization layer PNL may be formed of resin such as photo acryl, polyimide, or the like.

A plurality of organic light emitting devices R_OLED, G_OLED, and B_OLED may be formed on the planarization layer PNL. Each of the organic light emitting devices R_OLED, G_OLED, and B_OLED may include an anode electrode RAND/GAND/BAND, an organic light emitting layer OL, and a cathode electrode CAT. The organic light emitting devices R_OLED, G_OLED, and B_OLED may be divided by a bank BA.

A plurality of anode electrodes RAND, GAND, and BAND may be formed on the planarization layer PNL. The anode electrodes RAND, GAND and BAND may be connected to the source electrode DT_SE of the driving transistor DT through an anode contact hole C_AND that passes through the planarization layer PNL.

The bank BA may divide the anode electrodes RAND, GAND, and BAND. The bank BA may be formed to cover an edge of each of the anode electrodes RAND, GAND, and BAND.

The organic light emitting layer OL may be formed on the anode electrodes RAND, GAND, and BAND and the bank BA. The organic light emitting layer OL may include a hole transporting layer, a light emitting layer, and an electron transporting layer. In this case, when a voltage is applied to the anode electrode and the cathode electrode CAT, a hole and an electron may move to the light emitting layer through the hole transporting layer and the electron transporting layer and may be combined with each other in the light emitting layer to emit light.

The organic light emitting layer OL may include only a white light emitting layer that emits white light, and in this case, the white light emitting layer may be formed as a common layer all over the emissive part EA. Alternatively, the organic light emitting layer OL may include a red light emitting layer that emits red light, a green light emitting layer that emits green light, and a blue light emitting layer that emits blue light. In this case, the red light emitting layer may be formed on a red anode electrode RAND, the green light emitting layer may be formed on a green anode electrode GAND, and the blue light emitting layer may be formed on a blue anode electrode BAND.

The cathode electrode CAT may be formed to cover the organic light emitting layer OL. The cathode electrode CAT may be formed as a common layer all over the emissive part EA.

In the top emission type, in order to obtain a micro-cavity effect, the anode electrodes RAND, GAND and BAND may be formed of a metal material having high reflectivity like Aluminum (Al) and a stacked structure which includes Aluminum (Al) and indium tin oxide (ITO). Furthermore, in the top emission type, light emitted from the organic light emitting layer OL may be output in a direction toward the second substrate 112, and thus, the cathode electrode CAT may be formed of a transparent metal material such as indium tin oxide (ITO), indium zinc oxide (IZO), or the like which transmits light, or may be formed of a semi-transparent metal material such as magnesium (Mg), silver (Ag), or the like.

An encapsulation layer ENC may be formed on the cathode electrode CAT. The encapsulation layer ENC prevents oxygen or water from penetrating into the organic light emitting devices R_OLED, G_OLED and B_OLED. To this end, the encapsulation layer ENC may include a first inorganic layer INL1, an organic layer ORL, and a second inorganic layer INL2.

The first inorganic layer INL1 may be formed on the cathode electrode CAT to cover the cathode electrode CAT. The organic layer ORL may be formed on the first inorganic layer INL1 for preventing particles from penetrating into the organic light emitting layer OL and the cathode electrode CAT through the first inorganic layer INL1. The second inorganic layer INL2 may be formed on the organic layer ORL to cover the organic layer ORL.

Either or both of the first and second inorganic layers INL1 and INL2 may be formed of silicon nitride, aluminum nitride, zirconium nitride, titanium nitride, hafnium nitride, tantalum nitride, silicon oxide, aluminum oxide, or titanium oxide. For example, each of the first and second inorganic layers INL1 and INL2 may be formed of $SiO_2$, $Al_2O_3$, SiON, SiNx, or the like. The organic layer ORL may be transparently formed for transmitting the light emitted from the organic light emitting layer OL.

A plurality of color filters RC, GC, and BC may be formed on one surface of the second substrate 112 facing the first substrate 111. A red color filter RC may be disposed in correspondence with the red anode electrode RAND, a green color filter GC may be disposed in correspondence with the green anode electrode GAND, and a blue color filter BC may be disposed in correspondence with the blue anode electrode BAND. When the organic light emitting layer OL includes the red light emitting layer that emits the red light, the green light emitting layer that emits the green light, and the blue light emitting layer that emits the blue light, the color filters RC, GC, and BC may be omitted.

The color filters RC, GC, and BC may be divided by a black matrix BM. That is, the black matrix BM may be formed on a boundary between the color filters RC, GC, and BC.

The first substrate 111 may be bonded to the second substrate 112 by an adhesive layer SEAL. In detail, the adhesive layer SEAL may bond the encapsulation layer ENC of the first substrate 111 to the color filters RC, GC, and BC of the second substrate 112, and thus, the first substrate 111 may be bonded to the second substrate 112.

Figure 7:
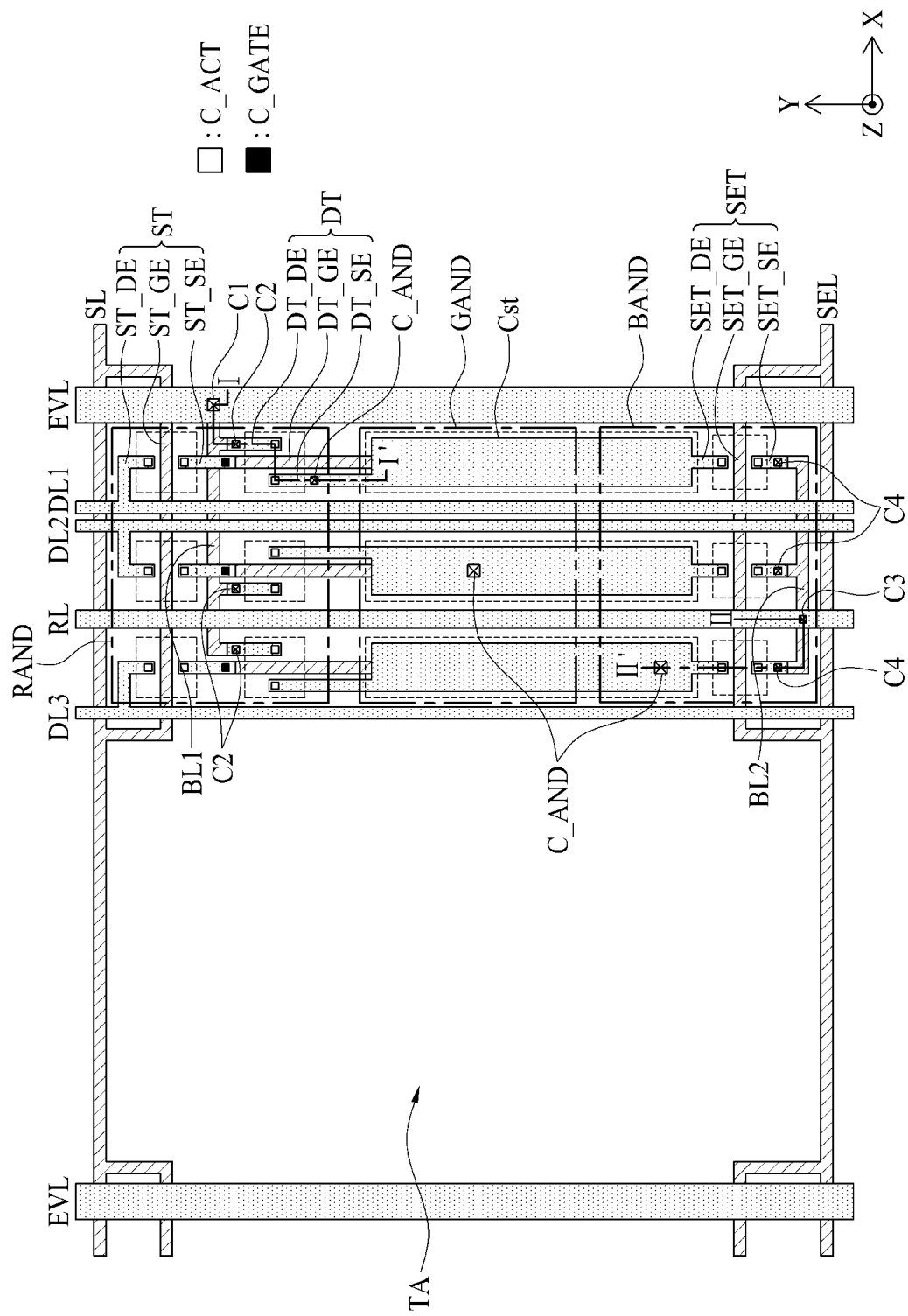
FIG. 7 is a plan view illustrating in detail another example of an emissive part and a transmissive part illustrated in FIG. 3.

FIG. 7 is a plan view illustrating in detail another example of the emissive part and the transmissive part illustrated in FIG. 3. In FIG. 4, it is illustrated that the emissive part EA is disposed on the left, the transmissive part TA is disposed on the right, and the power line is disposed on a left end. In FIG. 7, however, it is illustrated that the transmissive part TA is disposed on the left, the emissive part EA is disposed on the right, and the power line is disposed on a right end. That is, except that the emissive part EA and the transmissive part TA illustrated in FIG. 4 are mirror-symmetric, the emissive part EA and the transmissive part TA illustrated in FIG. 7 may be substantially the same as the emissive part EA and the transmissive part TA illustrated in FIG. 4. Thus, detailed descriptions of the emissive part EA and the transmissive part TA illustrated in FIG. 7 are not provided.

Moreover, a cross-sectional surface taken along line I-I' and a cross-sectional surface taken along line II-II' in FIG. 7 are substantially the same as the details described above with reference to FIGS. 5 and 6. Thus, detailed descriptions of the cross-sectional surface taken along line I-I' and the cross-sectional surface taken along line II-II' in FIG. 7 are not provided.

Figure 8:
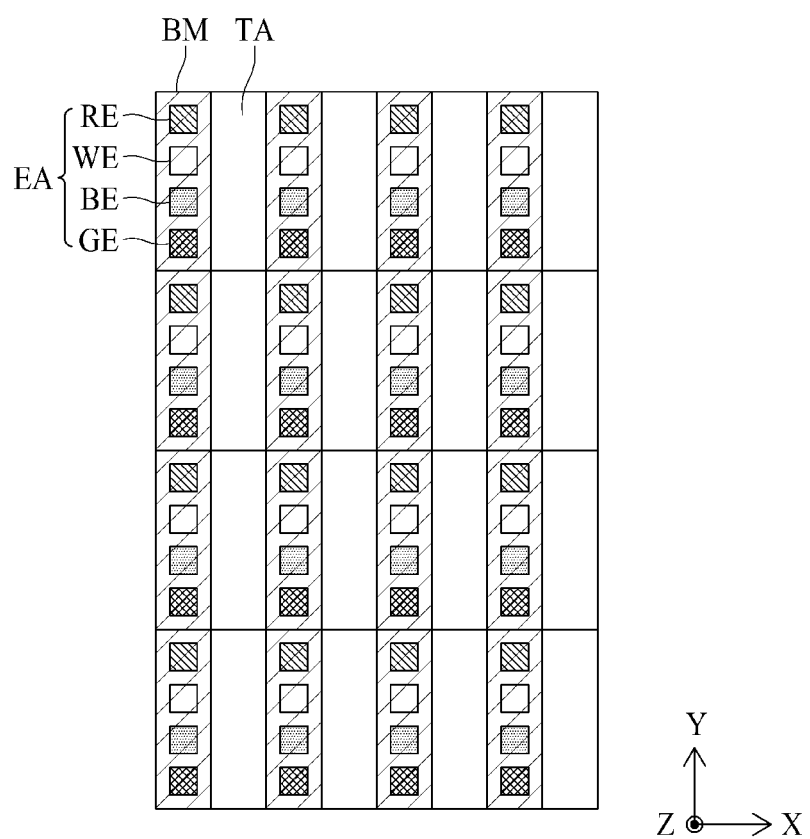
FIG. 8 is a plan view illustrating a portion of a display area of a display panel according to another embodiment.

FIG. 8 is a plan view illustrating a portion of a display area of a display panel according to another embodiment. Except that an emissive part EA further includes a white emissive part WE emitting white light, details of FIG. 8 are substantially the same as the details described above with reference to FIG. 3. Thus, duplicate descriptions of an emissive part EA and a transmissive part TA illustrated in FIG. 8 are not provided.

Referring to FIG. 8, the emissive part EA may include a plurality of emissive subparts. In FIG. 8, the emissive part EA is illustrated as including a red emissive part RE, a green emissive part GE, a blue emissive part BE, and a white emissive part WE. The red emissive part RE may be an area which emits red light, and the green emissive part GE may be an area which emits green light. The blue emissive part BE may be an area which emits blue light, and the white emissive part WE may be an area which emits white light. In the plurality of emissive subparts included in the emissive part EA, adjacent emissive subparts may be divided by a black matrix BM.

Figure 9:
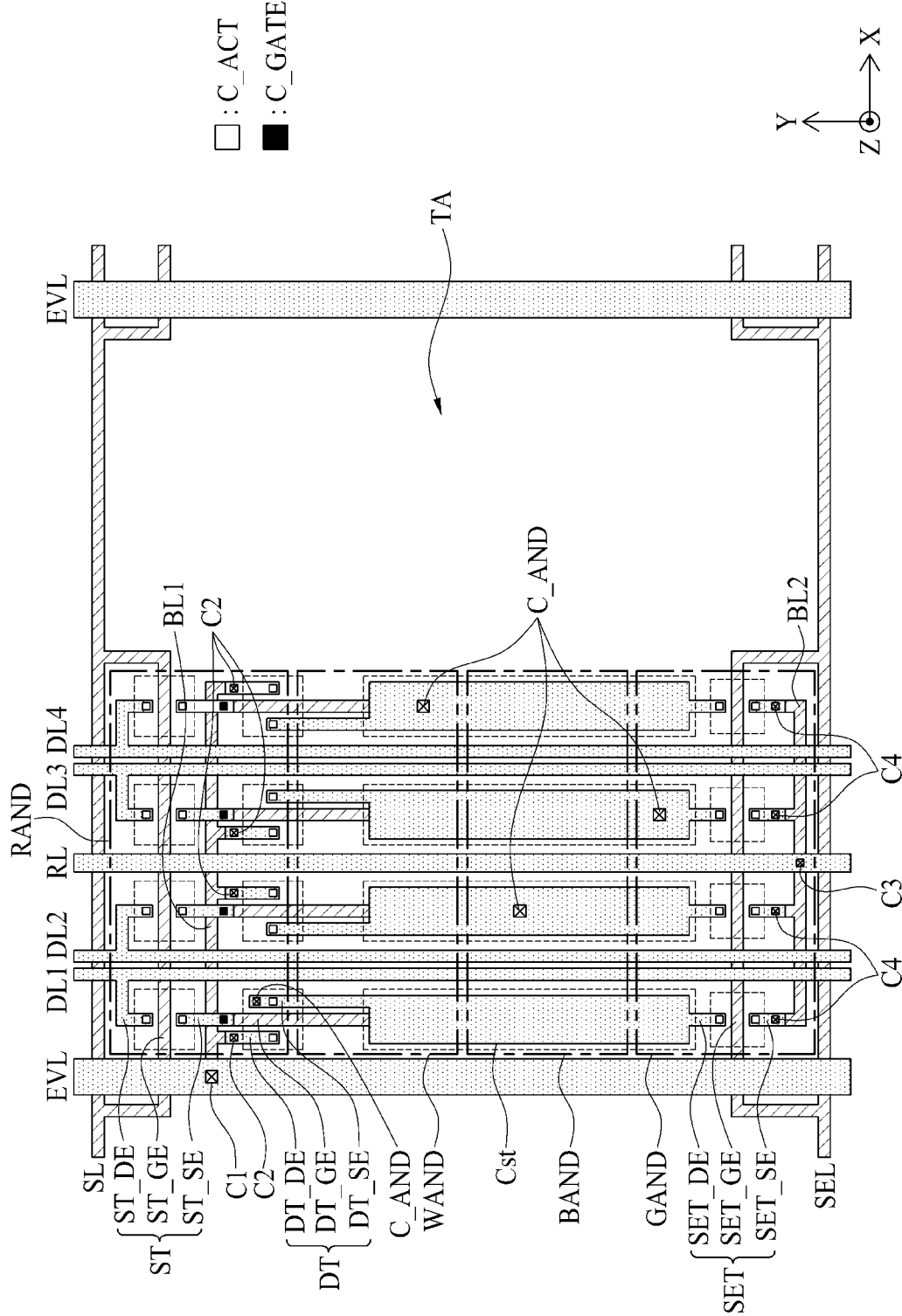
FIG. 9 is a plan view illustrating in detail another example of an emissive part and a transmissive part illustrated in FIG. 8.

FIG. 9 is a plan view illustrating in detail another example of the emissive part and the transmissive part illustrated in FIG. 8. In FIG. 3, the emissive part EA is illustrated as including three emissive subparts which include the red emissive part, the green emissive part, and the blue emissive part. In FIG. 9, an emissive part EA is illustrated as including four emissive subparts which include a red emissive part, a green emissive part, a blue emissive part, and a white emissive part. That is, except that the emissive part EA of FIG. 9 further includes one emissive subpart, details of FIG. 9 are the substantially same as the details described above with reference to FIG. 3.

In FIG. 9, since one emissive subpart is additionally provided, a data line, a scan transistor, a driving transistor, a sensing transistor, a capacitor, and an anode electrode are further provided in comparison with FIG. 4. A fourth data line DL4 may be disposed adjacent to the third data line DL3. However, other horizontal orderings of the data lines D1, D2, D3, and D4, as well as the corresponding transistors DT, ST, and SET and capacitors, are possible. An emissive subpart corresponding to the white emissive part may include a driving transistor DT, a scan transistor ST, a sensing transistor SET, a capacitor Cst, and an organic light emitting device similar to those described with respect to the red, green, and blue emissive parts of FIGS. 4, 5, and 6. The white anode electrode WAND of the organic light emitting device included in the white emissive part is disposed between the red anode RAND and the blue anode BAND. However, other vertical orderings of the anode electrodes RAND, GAND, BAND, and WAND are possible.

Otherwise, the data lines, the scan transistor, the driving transistor, the sensing transistor, the capacitor, and the anode electrode which are further provided in FIG. 9 are substantially the same as the data line, the scan transistor, the driving transistor, the sensing transistor, the capacitor, and the anode electrode explained with reference to FIG. 4. Thus, duplicate descriptions of the emissive part EA and a transmissive part TA illustrated in FIG. 9 are not provided.

Moreover, a cross-sectional surface taken along line I-I' and a cross-sectional surface taken along line II-II' in FIG. 9 are substantially the same as the details described above with reference to FIGS. 5 and 6. Thus, duplicate descriptions of the cross-sectional surface taken along line I-I' and the cross-sectional surface taken along line II-II' in FIG. 9 are not provided.

Figure 10:
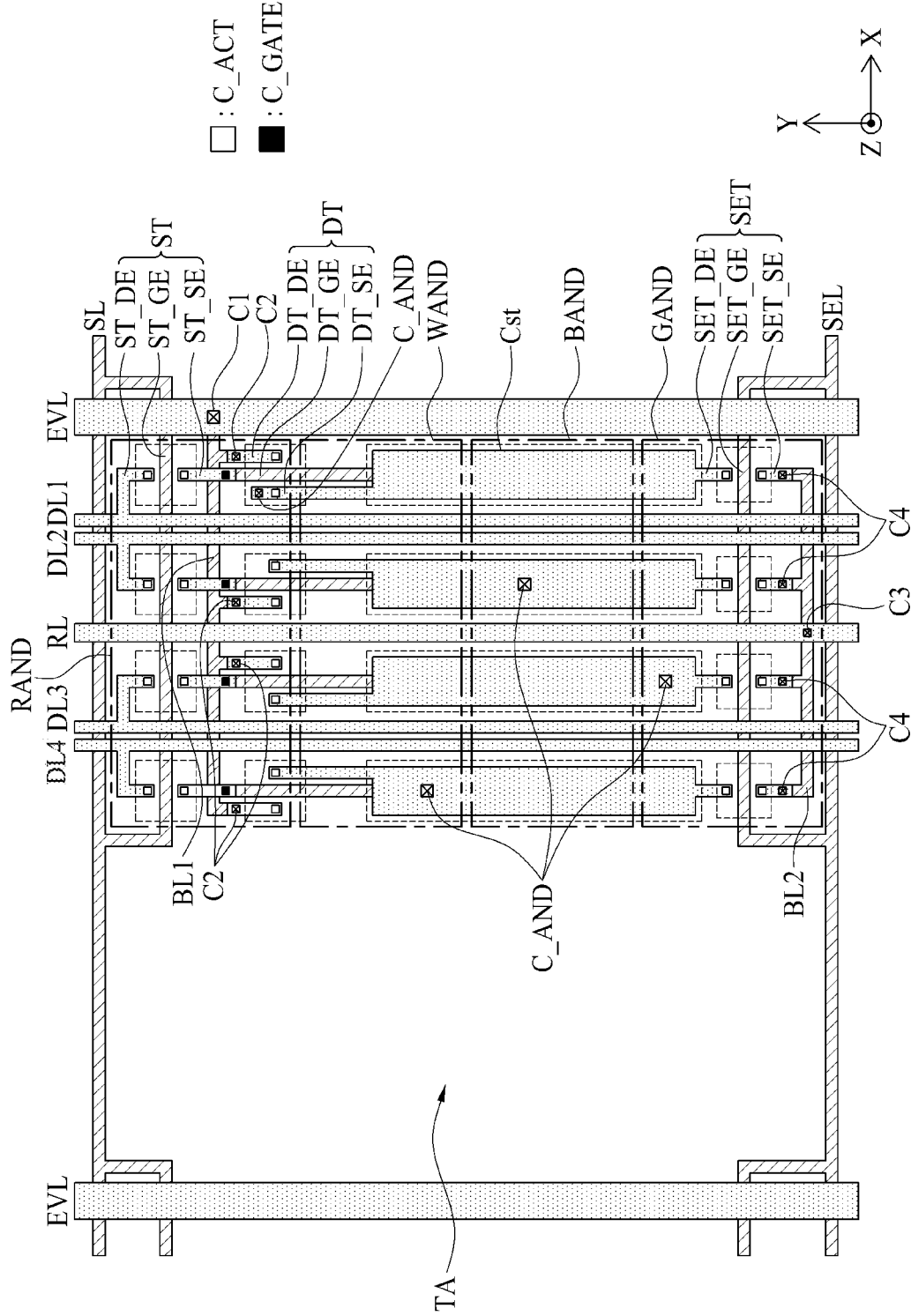
FIG. 10 is a plan view illustrating in detail another example of an emissive part and a transmissive part illustrated in FIG. 8.

FIG. 10 is a plan view illustrating in detail another example of the emissive part and the transmissive part illustrated in FIG. 8. In FIG. 10, it is illustrated that the emissive part EA is disposed on the left, the transmissive part TA is disposed on the right, and the power line is disposed on a left end. In FIG. 9, however, it is illustrated that the transmissive part TA is disposed on the left, the emissive part EA is disposed on the right, and the power line is disposed on a right end. That is, except that the emissive part EA and the transmissive part TA illustrated in FIG. 9 are mirror-symmetric, the emissive part EA and the transmissive part TA illustrated in FIG. 10 may be substantially the same as the emissive part EA and the transmissive part TA illustrated in FIG. 9. Thus, duplicate descriptions of the emissive part EA and the transmissive part TA illustrated in FIG. 10 are not provided.

Figure 11:
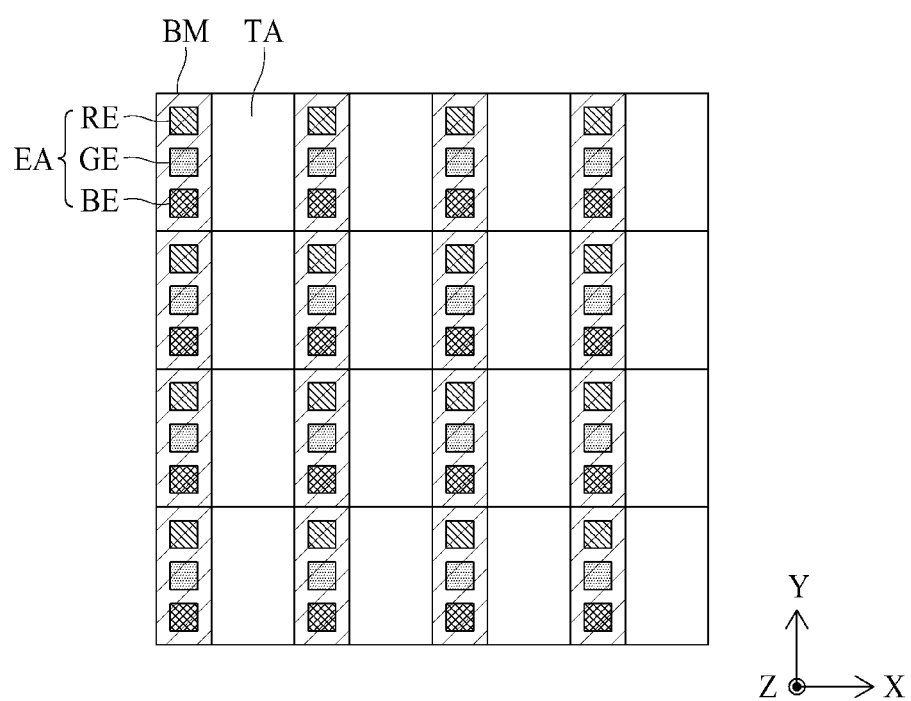
FIG. 11 is a plan view illustrating a portion of a display area of a display panel according to another embodiment.

FIG. 11 is a plan view illustrating a portion of a display area of a display panel according to another embodiment. Except that an area of a transmissive part TA is wider than that of an emissive part EA, the transmissive part TA and the emissive part EA illustrated in FIG. 11 are substantially the same as the details described above with reference to FIG. 3. Thus, detailed descriptions of the emissive part EA and the transmissive part TA illustrated in FIG. 11 are not provided.

Referring to FIG. 11, the area of the transmissive part TA may be wider than that of the emissive part EA. In this case, when the transparent display device does not display an image, a user can more clearly look at a background behind the transparent display device. However, as the area of the transmissive part TA is widened, the area of the emissive part EA is reduced. For this reason, when the area of the transmissive part TA is far wider than that of the emissive part EA, the transmissive part TA is recognized as a white band by the user while the transparent display device is displaying an image. That is, the image quality of the transparent display device is degraded. Therefore, the area of the transmissive part TA may not exceed two times the area of the emissive part EA (e.g., the area of the subpixels emitting light within a pixel). The area of the transmissive part TA and the area of the emissive part EA may be appropriately predetermined in consideration of visibility of a background behind the transparent display device and degradation of image quality.

It will be apparent to those skilled in the art that various modifications and variations can be made in the disclosed subject matter without departing from the spirit or scope of the disclosed subject matter. Thus, it is intended that the present invention covers the modifications and variations of this invention provided they come within the scope of the appended claims and their equivalents.

What is claimed is:

1. A display device comprising:
a plurality of pixels, wherein each of the plurality of pixels includes at least three sub-emissive parts and one transmissive part;
a plurality of data lines arranged along at least two sub-emissive parts of a first pixel from the plurality of pixels in a first direction;
a plurality of scan lines arranged in a second direction across the plurality of data lines,
wherein a scan line from the plurality of scan lines has a closed loop between a first transmissive part and a second transmissive part of the second direction.

2. The display device of claim 1, wherein the closed loop of the scan line is overlaid with at least two sub-emissive parts between the first transmissive part and the second transmissive part.

3. The display device of claim 1, further comprising:
a plurality of driving transistors arrayed in at least one sub-emissive part,
wherein each of the plurality of driving transistors connects to a corresponding one of each sub emissive part; and
wherein one sub-emissive part of the at least two sub-emissive parts overlays with one of the plurality of driving transistors connected to another one of the at least two sub-emissive parts.

4. The display device of claim 1, wherein the closed loop of the scan line starts from one side of the at least two sub-emissive parts and ends at another side of the at least two sub-emissive parts.

5. The display device of claim 1, wherein the at least two sub-emissive parts have at least two anode electrodes,
wherein one anode electrode among the at least two anode electrodes overlaps with another driving transistor connected to another anode electrode among the at least two anode electrodes.

6. The display device of claim 1, further comprising:
a plurality of scan transistors, each of the plurality of scan transistors connecting to a corresponding one of each sub-emissive part within the first pixel, wherein one sub-emissive part of the at least two sub-emissive parts overlays with the scan transistor connected to another one of the sub-emissive parts of the at least two sub-emissive parts.

7. The display device of claim 1, further comprising:
a plurality of capacitors, each of the plurality of capacitors connecting to the corresponding one of each sub-emissive part within the first pixel,
wherein the one sub-emissive part of the at least two sub-emissive parts overlays with a capacitor connected to another one of the sub-emissive parts of the at least two sub-emissive parts.

8. The display device of claim 1, wherein the at least two sub-emissive parts are arranged along the first direction,
wherein the one transmissive part is disposed adjacent to the at least two sub-emissive parts in the second direction within the first pixel and transmitting incident light,
wherein the second direction intersects with the first direction, and
wherein each of the plurality of data lines overlaps with the at least two sub-emissive parts within the first pixel.

9. The display device of claim 8, further comprising:
a plurality of sensing lines arranged in the second direction, the plurality of sensing lines arranged across the plurality of data lines.

10. The display device of claim 9, wherein each transmissive part is disposed between one of the plurality of scan lines and one of the plurality of sensing lines.

11. The display device of claim 8, further comprising:
a plurality of power lines arranged in the first direction,
wherein the plurality of power lines overlap with the plurality of pixels and are arranged parallel to the plurality of transmissive parts.

12. The display device of claim 11, further comprising:
a plurality of reference voltage line arranged in the first direction along the plurality of data lines,
wherein the plurality of reference voltage lines overlap with the plurality of pixels and are arranged along the plurality of transmissive parts.

13. The display device of claim 12, further comprising:
a first bridge line connecting a corresponding power line from the plurality of power lines to the plurality of driving transistors, the first bridge line crossing at least one of the plurality of data lines.

14. The display device of claim 13, further comprising:
a second bridge line connecting a corresponding reference voltage line from the plurality of reference voltage lines to the plurality of sensing transistors, the second bridge line intersecting at least one of the plurality of data lines, wherein the first bridge line is arranged along the second bridge line.

15. The display device of claim 3, wherein each of the sub-emissive parts of the at least two sub-emissive parts comprises:
an organic light emitting device including an anode electrode, an organic light emitting layer, and a cathode electrode.

16. The display device of claim 1, wherein the at least two sub-emissive parts correspond to at least two of red light, green light, and blue light.

17. The display device of claim 1, wherein the at least two sub-emissive parts include at least two of four sub emissive-parts corresponding to red light, green light, blue light, and white light.

18. The display device of claim 1, wherein an area of the first transmissive part is less than two times of an area of the at least two sub-emissive parts of each of the plurality of pixels.

19. The display device of claim 1, wherein each of the plurality of pixels includes at least one capacitor overlapping with at least two sub-emissive parts in the first pixel.

* * * * *